United States Patent
Kawase et al.

(10) Patent No.: US 7,481,949 B2
(45) Date of Patent: Jan. 27, 2009

(54) POLISHING COMPOSITION AND RINSING COMPOSITION

(75) Inventors: Akihiro Kawase, Kasugai (JP); Toshihiro Miwa, Aichi (JP); Kenji Sakamoto, Gifu (JP); Ichiro Hayashida, Iruma (JP)

(73) Assignee: Wako Pure Chemical Industries, Ltd, Osaka (JP)

( * ) Notice: Subject to any disclaimer, the term of this patent is extended or adjusted under 35 U.S.C. 154(b) by 348 days.

(21) Appl. No.: 10/533,888

(22) PCT Filed: Nov. 7, 2003

(86) PCT No.: PCT/JP03/14224

§ 371 (c)(1),
(2), (4) Date: Dec. 21, 2005

(87) PCT Pub. No.: WO2004/042812

PCT Pub. Date: May 21, 2004

(65) Prior Publication Data

US 2006/0151854 A1    Jul. 13, 2006

(30) Foreign Application Priority Data

Nov. 8, 2002    (JP) .............................. 2002-325220

(51) Int. Cl.
*C09K 13/00* (2006.01)
*H01L 21/302* (2006.01)

(52) U.S. Cl. .................... 252/79.1; 252/79.4; 252/79.5; 438/692; 438/693

(58) Field of Classification Search ................ 438/692, 438/693; 252/79.1, 79.4, 79.5
See application file for complete search history.

(56) References Cited

U.S. PATENT DOCUMENTS 3,715,842 A    2/1973  Tredinnick ................... 51/281
4,169,337 A    10/1979 Payne ........................... 451/41
4,462,188 A    7/1984  Payne ........................... 451/41
4,588,421 A    5/1986  Payne ........................... 51/308
5,230,833 A    7/1993  Romberger et al. ...... 252/363.5
5,352,277 A    10/1994 Sasaki ............................ 106/6
5,705,089 A *  1/1998  Sugihara et al. ............ 252/79.1

(Continued)

FOREIGN PATENT DOCUMENTS

EP    0 496 605 A2    1/1992

(Continued)

*Primary Examiner*—Binh X Tran
(74) *Attorney, Agent, or Firm*—Vidas, Arrett & Steinkraus PA

(57) ABSTRACT

A polishing composition and a rinsing composition according to the present invention can effectively suppress wafer contamination caused by metal impurities. The polishing composition includes a chelating agent, an alkali compound, silicon dioxide and water. The rinsing composition includes a chelating agent, an alkali compound and water. The chelating agent contained in the polishing composition and the rinsing composition is an acid represented by the following chemical formula (1) or a salt thereof. In the chemical formula (1), each of $Y^2$ and $Y^3$ represents an alkylene group, n is an integer of 0 to 4, each of 4+n substituents represented by $R^8$ to $R^{12}$ is an alkyl group. At least four of the alkyl groups have a phosphonic acid group.

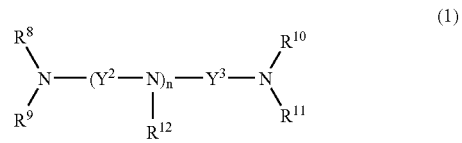

(1)

17 Claims, 1 Drawing Sheet

U.S. PATENT DOCUMENTS

| | | | |
|---|---|---|---|
| 5,916,819 A | 6/1999 | Skrovan et al. | 438/692 |
| 6,099,604 A | 8/2000 | Sandhu et al. | 51/307 |
| 6,280,652 B1 | 8/2001 | Inoue et al. | 252/79.1 |
| 6,454,820 B2 | 9/2002 | Hagihara et al. | 51/308 |
| 2001/0003672 A1 | 6/2001 | Inoue et al. | 438/690 |
| 2002/0059755 A1* | 5/2002 | Kido et al. | 51/309 |
| 2002/0077259 A1* | 6/2002 | Skee | 510/175 |
| 2002/0151252 A1 | 10/2002 | Kawase et al. | 451/36 |
| 2002/0194789 A1* | 12/2002 | Oshima | 51/308 |
| 2003/0082998 A1* | 5/2003 | Carter et al. | 451/41 |
| 2004/0029395 A1* | 2/2004 | Zhang et al. | 438/748 |
| 2004/0098924 A1 | 5/2004 | Iwasa | 51/302 |
| 2004/0127017 A1 | 7/2004 | Jung et al. | 438/637 |
| 2005/0054203 A1 | 3/2005 | Yamada | 438/695 |

FOREIGN PATENT DOCUMENTS

| | | |
|---|---|---|
| EP | 0789071 A1 | 7/1996 |
| EP | 0 858 102 A2 | 8/1998 |
| EP | 0 858 102 A3 | 8/1998 |
| JP | 63-272460 | 11/1988 |
| JP | 11-116984 | 4/1999 |
| JP | 2001-077063 | 3/2001 |
| JP | 2001-131535 | 5/2001 |
| JP | 2001-308052 | 11/2001 |
| WO | WO 99/32570 | 7/1999 |
| WO | WO 01/04231 | 1/2001 |
| WO | WO 02/33033 A1 | 4/2002 |

* cited by examiner

POLISHING COMPOSITION AND RINSING COMPOSITION

FIELD OF THE INVENTION

The present invention relates to a polishing composition and a rinsing composition, and more particularly, it relates to a polishing composition used for polishing silicon wafers and a rinsing composition used for rinsing silicon wafers.

BACKGROUND OF THE INVENTION

In processes for semiconductor device production, silicon wafers are mechanically and chemically polished using a polishing composition. Thereafter, the polished silicon wafers are generally rinsed using water or a rinsing composition such that the silicon wafers are protected from remaining silicon dioxide and metal impurities contained in the polishing composition.

A conventional polishing composition disclosed in Japanese Laid-Open Patent Publication No. 63-272460 contains at least one chelating agent such as ethylenediaminetetraacetic acid (EDTA), and a high molecular ion having a molecular weight of 5000 or more such as polyacrylic acid, in addition to water and particulate amorphous silica. Another conventional polishing composition disclosed in Japanese Laid-Open Patent Publication No. 2001-77063 contains polishing particles, amines such as piperazine, and a chelating agent such as EDTA.

These conventional polishing compositions prevent the silicon wafers from being contaminated by metal impurities contained in the polishing compositions by virtue of the chelating agent that coordinates with a metal element to form a stable complex ion. The chelating agents contained in the conventional polishing compositions, however, do not have a very high capability for capturing metal impurities. Therefore, in the case where semiconductor devices are fabricated from silicon wafers polished using the prior art polishing compositions, poor conditions for semiconductors are often caused due to short circuits or leaks. The silicon wafer contamination caused by metal impurities means not only adhesion of metal impurities on the surface of the silicon wafer but also diffusion of metal impurities in the inside of the silicon wafer.

SUMMARY OF THE INVENTION

It is an objective of the present invention to provide a polishing composition and a rinsing composition, both of which compositions can effectively suppress wafer contamination caused by metal impurities.

In order to attain the above objective, the present invention provides the following polishing composition for use in polishing a silicon wafer. The polishing composition includes a chelating agent, an alkali compound, silicon dioxide and water. The chelating agent is an acid represented by the following chemical formula:

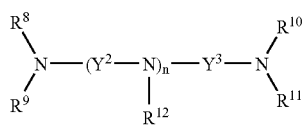

or a salt thereof. In the chemical formula, each of $Y^2$ and $Y^3$ represents an alkylene group, n is an integer of 0 to 4, each of 4+n substituents represented by $R^8$ to $R^{12}$ is an alkyl group and at least four of the alkyl groups have a phosphonic acid group.

Further, the present invention provides the following process for polishing a silicon wafer. The process includes the step of preparing a polishing composition and polishing the silicon wafer surface by using the polishing composition. The above polishing composition includes a chelating agent, an alkali compound, silicon dioxide and water. The chelating agent is an acid represented by the following chemical formula:

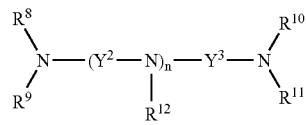

or a salt thereof. In the chemical formula, each of $Y^2$ and $Y^3$ represents an alkylene group, n is an integer of 0 to 4, each of 4+n substituents represented by $R^8$ to $R^{12}$ is an alkyl group and at least four of the alkyl groups have a phosphonic acid group.

Moreover, the present invention provides the following rinsing composition for use in rinsing a silicon wafer. The rinsing composition includes a chelating agent, an alkali compound and water. The chelating agent is an acid represented by the following chemical formula:

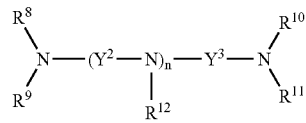

or a salt thereof. In the chemical formula, each of $Y^2$ and $Y^3$ represents an alkylene group, n is an integer of 0 to 4, each of 4+n substituents represented by $R^8$ to $R^{12}$ is an alkyl group and at least four of the alkyl groups have a phosphonic acid group.

In addition, the present invention provides the following process for rinsing a silicon wafer. The process includes the step of preparing a rinsing composition and rinsing the silicon wafer surface by using the rinsing composition. The above rinsing composition includes a chelating agent, an alkali compound and water. The chelating agent is an acid represented by the following chemical formula:

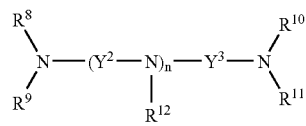

or a salt thereof. In the chemical formula, each of $Y^2$ and $Y^3$ represents an alkylene group, n is an integer of 0 to 4, each of 4+n substituents represented by $R^8$ to $R^{12}$ is an alkyl group and at least four of the alkyl groups have a phosphonic acid group.

DETAILED DESCRIPTION OF THE PREFERRED EMBODIMENTS

Figure 1:
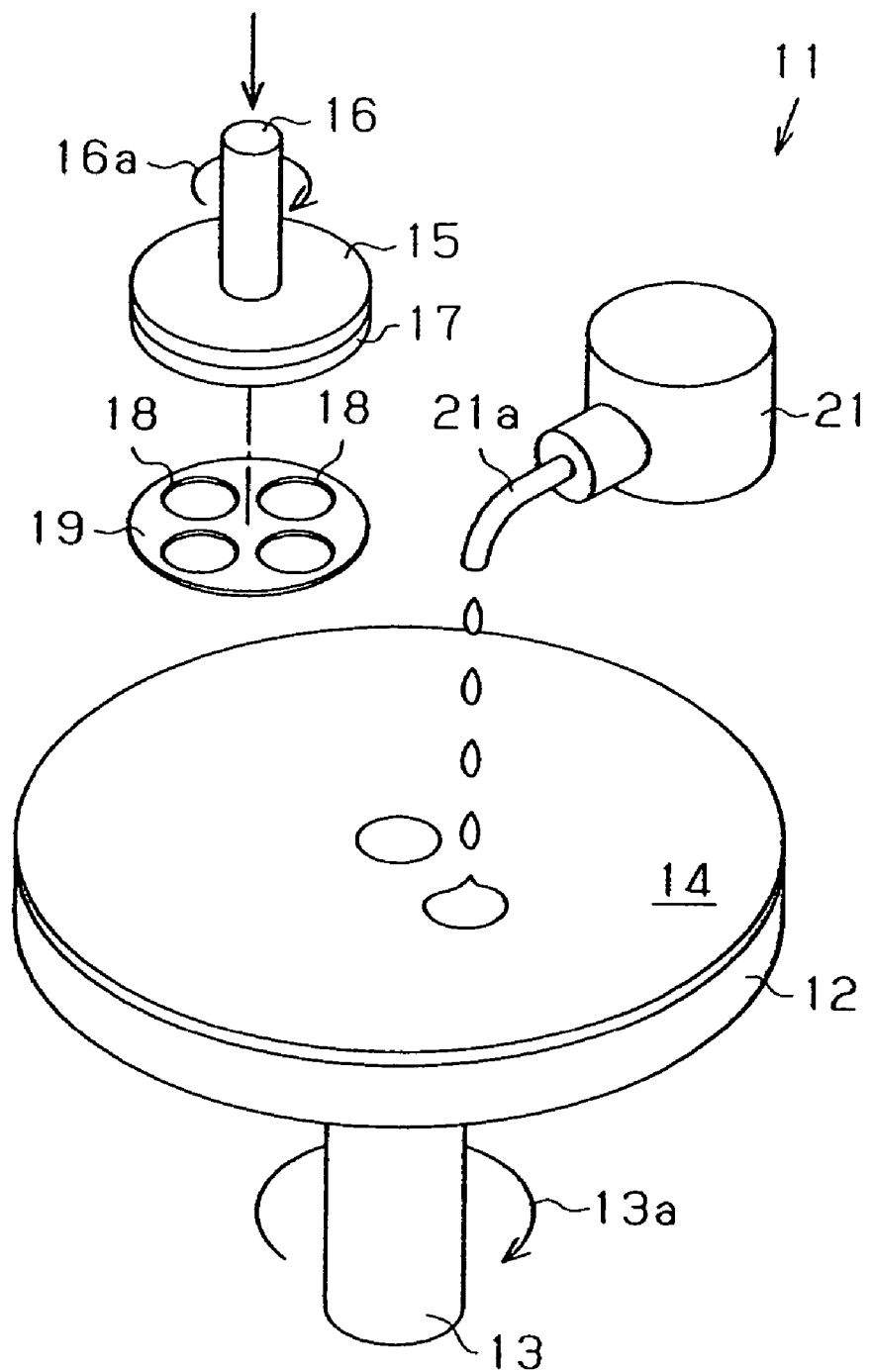
FIG. 1 is a perspective view showing a polishing apparatus used in polishing with the polishing composition and in rinsing with the rinsing composition.

Hereinafter, one embodiment of the present invention will be described.

First, the work process for silicon wafers is described. In the first place, a silicon single crystal ingot is sliced to prepare silicon wafers. The silicon wafers are made to have a predetermined shape by lapping. Next, each of the silicon wafers is etched in order to remove the silicon wafer surface layer deteriorated by the lapping. After the etching, the edge and the surface of each silicon wafer are polished successively and then the silicon wafer is rinsed.

The polishing composition according to this embodiment includes a chelating agent, an alkali compound, silicon dioxide and water, and is used in polishing the silicon wafer surface. The rinsing composition of this embodiment includes a chelating agent, an alkali compound and water, and is used in rinsing the silicon wafer surface.

The chelating agent is an acid represented by the formula 1:

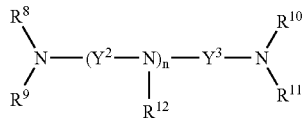

or a salt thereof, and the chelating agent is coordinated to a metal element to form a stable complex ion. The chelating agent contained in the polishing composition plays a role in capturing metal impurities contained in the polishing composition, and the chelating agent contained in the rinsing composition plays a role in capturing metal impurities remaining in silicon wafers.

Each of $Y^2$ and $Y^3$ in the chemical formula 1 represents an alkylene group. The alkylene group may be linear or branched. The alkylene group is preferably a lower alkylene group having 1 to 4 carbon atoms. The chelating agent in which the alkylene group is a lower alkylene group has a high capability for capturing metal impurities. Specific examples of the lower alkylene group may include a methylene group, an ethylene group, a propylene group, a methylmethylene group, a methylethylene group, an ethylmethylene group, a butylene group, a methylpropylene group and an ethylethylene group. n in the chemical formula 1 is an integer of 0 to 4, and preferably an integer of 0 to 2. The chelating agent in which n is an integer of 0 to 2 is easily synthesized.

Each of $R^8$ to $R^{12}$ in the chemical formula 1 represents an alkyl group. The alkyl group may be linear or branched. The alkyl group is preferably a lower alkyl group having 1 to 4 carbon atoms. The chelating agent in which the alkyl group is a lower alkyl group has a high capability for capturing metal impurities. Specific examples of the lower alkyl group may include a methyl group, an ethyl group, a n-propyl group, an isopropyl group, a n-butyl group, an isobutyl group, a sec-butyl group and a tert-butyl group.

Among 4+n alkyl groups represented by $R^8$ to $R^{12}$, at least four alkyl groups, preferably all the 4+n alkyl groups have a phosphonic acid group. The chelating agent in which all the 4+n alkyl groups have a phosphonic acid group have a high capability of capturing metal impurities. Each alkyl group preferably has from 1 to 2 phosphonic acid groups, more preferably one phosphonic acid group.

From the viewpoint of having a high capability of capturing metal impurities, preferable examples of the chelating agent may include ethylenediaminetetraethylenephosphonic acid, ethylenediaminetetramethylenephosphonic acid (EDTP), diethylenetriaminepentaethylenephosphonic acid, diethylenetriaminepentamethylenephosphonic acid (DTPP), triethylenetetraminehexaethylenephosphonic acid, triethylenetetraminehexamethylenephosphonic acid (TTHP), propanediaminetetraethylenephosphonic acid and propanediaminetetramethylenephosphonic acid, and their ammonium salts, potassium salts, sodium salts and lithium salts. From the viewpoint of having a particularly high capability for capturing metal impurities, more preferable examples of the chelating agent may include ethylenediaminetetraethylenephosphonic acid, EDTP, ammonium ethylenediaminetetramethylenephosphonate, potassium ethylenediaminetetramethylenephosphonate (EDTPP), sodium ethylenediaminetetramethylenephosphonate, lithium ethylenediaminetetramethylenephosphonate, diethylenetriaminepentaethylenephosphonic acid, DTPP, ammonium diethylenetriaminepentamethylenephosphonate, potassium diethylenetriaminepentamethylenephosphonate (DTPPP), sodium diethylenetriaminepentamethylenephosphonate, lithium diethylenetriaminepentamethylenephosphonate, triethylenetetraminehexaethylenephosphonic acid, TTHP, ammonium triethylenetetraminehexamethylenephosphonate, potassium triethylenetetraminehexamethylenephosphonate (TTHPP), sodium triethylenetetraminehexamethylenephosphonate, lithium triethylenetetraminehexamethylenephosphonate, propanediaminetetraethylenephosphonic acid, propanediaminetetramethylenephosphonic acid, ammonium propanediaminetetramethylenephosphonate, potassium propanediaminetetramethylenephosphonate, sodium propanediaminetetramethylenephosphonate and lithium propanediaminetetramethylenephosphonate. Each of the polishing composition and the rinsing composition may contain one kind of the chelating agent or two or more kinds of the chelating agents.

In the polishing composition and the rinsing composition, the content of the chelating agent is preferably from 0.001 to 6% by weight, more preferably 0.005 to 3% by weight, most preferably 0.01 to 1% by weight. A polishing composition and a rinsing composition having too low of a content of the chelating agent do not satisfactorily suppress silicon wafer contamination caused by metal impurities. A polishing composition and a rinsing composition having too much of a content of the chelating agent are easily gelled and are uneconomical.

The above-described alkali compound is contained in the polishing composition and the rinsing composition for maintaining alkaline conditions for the polishing composition and the rinsing composition. The alkali compound contained in the polishing composition plays a role in accelerating polishing of the silicon wafer surface by chemical actions such as corrosion, etching and oxidation.

Specific examples of the alkali compound may include inorganic alkali compounds such as potassium hydroxide (PHA), sodium hydroxide (NHA), potassium hydrogen carbonate (PCAH), potassium carbonate (PCA), sodium hydrogen carbonate (NCAH) and sodium carbonate (NCA); ammonia (AM); ammonium salts such as tetramethyl ammonium hydroxide (TMAH), ammonium hydrogen carbonate (ACAH) and ammonium carbonate (ACA); and amines such as methylamine (MA), dimethylamine (DMA), trimethylamine (TMA), ethylamine (EA), diethylamine (DEA), triethylamine (TEA), ethylenediamine (EDA), monoethanolamine (MEA), N-(β-aminoethyl)ethanolamine (AEEA), hexamethylenediamine (HMDA), diethylenetriamine (DETA), triethylenetetramine (TETA), piperazine anhydride (PIZ), piperazine hexahydrate, 1-(2-aminoethyl)piperazine (AEPIZ) and N-methylpiperazine (MPIZ). Because of having low amine odor, preferable examples of the alkali compound may include PHA, NHA, PCAH, PCA, NCAH, NCA, AM, TMAH, ACAH, ACA, EDA, MEA, AEEA, HMDA, DETA, TETA, PIZ, piperazine hexahydrate, AEPIZ and MPIZ. Because the alkali compound does not inhibit the functions of the chelating agent in addition to having a low amine odor, more preferable examples thereof may include PHA, NHA, PCAH, PCA, NCAH, NCA, AM, TMAH, ACAH, ACA, PIZ, piperazine hexahydrate, AEPIZ and MPIZ. The polishing composition and the rinsing composition may contain one kind of the alkali compounds or two or more kinds thereof.

In the case where the alkali compound is PHA, NHA, TMAH, ACAH, ACA, PCAH, PCA, NCAH, NCA, AM, MA, DMA, TMA, EA, DEA, TEA, EDA, MEA, AEEA, HMDA, DETA, or TETA, the polishing composition and the rinsing composition have a content of the alkali compounds of preferably from 0.1 to 6% by weight, more preferably 0.5 to 5% by weight, and most preferably 1 to 4% by weight. In the case where the alkali compound is PIZ, AEPIZ, or MPIZ, they have a content of the alkali compounds of preferably from 0.1 to 10% by weight, more preferably 1 to 9% by weight, most preferably 3 to 8% by weight, and in the case where the alkali compound is piperazine hexahydrate, they have a content of the alkali compounds of preferably from 0.1 to 20% by weight, more preferably 2 to 18% by weight, and most preferably 5 to 16% by weight. A polishing composition having too low of a content of the alkali compound does not have a very high polishing rate. A polishing composition and a rinsing composition having too much of a content of the alkali compound are easily gelled and are uneconomical as well as easily cause roughness on the silicon wafer surface.

The above-described silicon dioxide plays a role in mechanically polishing the silicon wafer surface. Examples of the silicon dioxide may include colloidal silica, fumed silica, precipitated silica and the like. Because of contributing to improvement in the polishing accuracy, colloidal silica is preferred as the silicon dioxide.

In the case where the silicon dioxide is colloidal silica, the silicon dioxide has an average particle diameter DSA, as determined from the specific surface area measured by a method of measuring specific surface area of powder with gas adsorption (BET method), of preferably from 5 to 300 nm, more preferably 5 to 200 nm, most preferably 5 to 120 nm, and in the case where the silicon dioxide is fumed silica or precipitated silica, the silicon dioxide has an average particle diameter $D_{SA}$ of preferably from 10 to 300 nm, more preferably 10 to 200 nm, and most preferably 10 to 150 nm. In the case where the silicon dioxide is colloidal silica, the silicon dioxide has an average particle diameter $D_{N4}$, as calculated from laser scattering, of preferably from 5 to 300 nm, more preferably 10 to 200 nm, and most preferably 15 to 150 nm, and in the case where the silicon dioxide is fumed silica or precipitated silica, the silicon dioxide has an average particle diameter $D_{N4}$ of preferably from 30 to 500 nm, more preferably 40 to 400 nm, and most preferably 50 to 300 nm. A polishing composition containing silicon dioxide having an average particle diameter $D_{SA}$ or $D_{N4}$ that is too small does not have a very high polishing rate. A polishing composition containing silicon dioxide having an average particle diameter $D_{SA}$ or $D_{N4}$ that is too large easily roughens the silicon wafer surface or easily causes defects such as scratches, and haze on the silicon wafer surface The silicon dioxide usually contains metal elements such as calcium and magnesium, as well as transition metal elements such as iron, nickel and copper, as metal impurities. In the 20% by weight of silicon dioxide aqueous solution, the total content of elements of iron, nickel, copper and calcium is preferably not more than 300 ppm, more preferably not more than 100 ppm, and most preferably not more than 0.3 ppm. When the total content is too much, silicon wafers are easily contaminated by metal impurities derived from the silicon dioxide, contained in the polishing composition and a large amount of the chelating agent needs to be contained in the polishing composition, so that the cost is increased.

The polishing composition has a silicon dioxide content of preferably 1 to 50% by weight, more preferably 5 to 50% by weight, and most preferably 10 to 50% by weight. A polishing composition having too low of a silicon dioxide content does not have a higher polishing rate, while a polishing composition having too much of a silicon dioxide content is easily gelled.

The above-described water plays a role as a medium capable of dispersing the silicon dioxide and dissolving the chelating agent and the alkali compound. The water, as much as possible, preferably does not contain impurities. Preferable examples of the water may include ion exchange water, pure water, ultra-pure water and distilled water.

The polishing composition and the rinsing composition preferably have a pH of from 8 to 12, and more preferably 10 to 12. A polishing composition having too low of a pH does not have very high polishing rate. A polishing composition and rinsing composition having too high of a pH are easily gelled. It is preferred that the pH of the polishing composition be almost the same as the pH of the rinsing composition. When the pH of the polishing composition is greatly different from the pH of the rinsing composition, during rinsing, the polishing composition remaining on the silicon wafer surface and polishing pad is gelled or roughness is generated on the silicon wafer surface.

With regard to the polishing composition and the rinsing composition, the polishing composition is prepared by mixing components other than water, namely the chelating agent, the alkali compound and silicon dioxide with water, and the rinsing composition is prepared by mixing components other than water, namely the chelating agent and alkali compound with water. In the mixing process, a blade type stirrer or an ultrasonic dispersion machine may be used.

Next, a polishing apparatus 11 as shown in FIG. 1 will be described.

The polishing apparatus 11 is equipped with a disk-like rotary platen 12 having a polishing pad 14 adhered on the upper surface thereof. The rotary platen 12 is rotatably provided to a first shaft 13 capable of rotating in the direction shown by the arrow 13a in FIG. 1 so as to rotate integrally with the first shaft 13. Above the rotary platen 12, at least one wafer holder 15 is provided. The wafer holder 15 is rotatably provided to a second shaft 16 capable of rotating in the direction shown by the arrow 16a in FIG. 1 so as to rotate integrally with the second shaft 16. On the bottom surface of the wafer holder 15, a wafer holding plate 19 having four wafer holding holes 18 is removably equipped through a ceramic plate 17 and an unillustrated urethane sheet. The polishing apparatus 11 is further equipped with a polishing composition feeder 21 and an unillustrated rinsing composition feeder. The polishing composition feeder 21 discharges the polishing composition through a nozzle 21a and the rinsing composition feeder discharges the rinsing composition through an unillustrated nozzle. Any one of the polishing composition feeder 21 and the rinsing composition feeder is disposed above the rotary platen 12. One feeder disposed above the rotary platen 12 can be replaced with the other feeder, which is not disposed above the rotary platen 12.

When silicon wafers are polished, the polishing composition feeder 21 is disposed above the rotary platen 12, as shown in FIG. 1. The silicon wafers for polishing are sucked into the wafer holding holes 18 and retained in the wafer holder 15. Firstly, the rotation of the wafer holder 15 and the rotary platen 12 is started, and the polishing composition is discharged from the polishing composition feeder 21 and fed to the polishing pad 14. Thereafter, the wafer holder 15 is moved toward the rotary platen 12 so that each of the silicon wafers is pressed on the polishing pad 14. Thus, the silicon wafer surface, which is in contact with the polishing pad 14, is polished.

Following the polishing, when the polished silicon wafers are rinsed, the rinsing composition feeder is disposed above the rotary platen 12 in place of the polishing composition feeder 21. The operation conditions for the polishing apparatus 11 are changed to the setting for rinsing from that for polishing. Thereafter, the rinsing composition is discharged from the rinsing composition feeder and thereby the rinsing composition is fed to the polishing pad 14. Thus, the silicon wafer surface, which is in contact with the polishing pad 14, is rinsed.

The polishing process for the silicon wafer surface is preferably carried out by division into a plurality of steps. For example, the silicon wafer surface may be polished in three steps including a first step of rough polishing, a second step of precise polishing, and a third step of finishing polishing. In this case, the silicon wafer is preferably rinsed every time a step is completed.

The embodiment has the following advantages.

The chelating agent contained in the polishing composition and the rinsing composition according to this embodiment has a higher capability for capturing metal impurities as compared with conventional chelating agents such as EDTA. In addition, the chelating agent with metal impurities captured electrostatically repels the silicon wafer surface showing a negative at a zeta potential. Accordingly, contamination of silicon wafer caused by metal impurities is effectively suppressed.

The polishing and rinsing of the silicon wafer are continuously carried out by the same polishing apparatus 11 while the silicon wafer is held in the wafer holder 15. Therefore, etching and stains on the silicon wafer surface caused by contacting the silicon wafer to the polishing composition for a long time after the completion of the polishing, are suppressed. Further, caking of foreign substances (particles) such as silicon dioxide, on the silicon wafer surface caused by drying is also suppressed and thereby LPD (Light Point Defect), which is one kind of surface defect in silicon wafers, is decreased. Furthermore, the labor hours and cost for the polishing and rinsing is decreased.

The above embodiment may be changed in the following manner.

The polishing composition may be prepared by diluting a stock solution containing a chelating agent, an alkali compound and silicon dioxide in a high concentration with water at the time of using the polishing composition. In this case, the storage and conveyance of the polishing composition is easy before the use thereof. As the polishing composition, the stock solution for the polishing composition is preferably diluted with water in a volume of from 1 to 50 times based on the volume of the stock solution, more preferably 1 to 40 times, and most preferably 1 to 20 times.

The rinsing composition may be prepared by diluting a stock solution containing a chelating agent and an alkali compound in a high concentration with water at the time of using the rinsing composition. In this case, the storage and conveyance of the rinsing composition is easy before the use thereof. As the rinsing composition, the stock solution for the rinsing composition is preferably diluted with water in a volume of from 1 to 100 times based on the volume of the stock solution, more preferably 1 to 80 times, and most preferably 1 to 40 times.

In place of the polishing apparatus 11 shown in FIG. 1, the silicon wafer polishing and rinsing may be carried out using a double-sided polishing apparatus capable of polishing both surfaces of a silicon wafer simultaneously.

After the completion of the polishing and rinsing, the silicon wafer surface may be subjected to scrubbing washing with, for example, a polyvinyl alcohol made sponge using a washing water such as pure water and ultra-pure water.

The polishing composition and the rinsing composition may contain conventionally known additives such as a surfactant and an antiseptic agent, as necessary. For example, the polishing composition and the rinsing composition may contain hydrogen peroxide. In this case, an oxidation film is formed on the silicon wafer surface by hydrogen peroxide and thereby particles do not adhere on the silicon wafer surface directly so that LPD is improved.

Before rinsing the polished silicon wafer surface, the wafer holder 15 may be kept away from the rotary platen 12 and thereby the silicon wafer may be detached once from the polishing pad 14. Then, the feeding of the rinsing composition to the polishing pad 14 may be started, the silicon wafer may be placed in contact with the polishing pad 14 again and rinsing thereof may be started.

Next, the present invention is further described in more detail with reference to the following Examples and Comparative Examples.

EXAMPLES 1 TO 14 AND COMPARATIVE EXAMPLES 1 TO 9

In each of Examples 1 to 14 and Comparative Examples 1 to 9, a polishing composition stock solution was prepared by mixing silicon dioxide, a chelating agent, an alkali compound and water. The silicon dioxide contained in each polishing composition stock solution is colloidal silica, and each polishing composition stock solution contains colloidal silica in an amount of 20% by weight. With regard to the chelating agent and the alkali compound contained in each polishing composition stock solution, the kinds and contents thereof are shown in Table 1. Furthermore, in a 20% by weight colloidal silica aqueous solution, the total content of elements of iron, nickel, copper and calcium is not more than 20 ppb. The colloidal silica has an average particle diameter $D_{SA}$, as measured by a FlowSorbII2300 manufactured by Micromeritics Co., of 35 nm and has an average particle diameter $D_{N4}$, as measured by an N4 Plus Submicron Particle Sizer manufactured by Beckman Coulter, Inc., of 70 nm. In each of Examples 1 to 14, the polishing composition stock solution has a pH of from 10 to 12. Each polishing composition stock solution was diluted to 20 times with ultra pure water to prepare a polishing composition, and using the polishing composition, the silicon wafer surface was polished under the following polishing conditions 1.

Polishing Conditions 1

Polishing apparatus: Single-sided polishing machine SPM-15 (equipped with four wafer holders each capable of holding four wafers) manufactured by Fujikoshi Machinery Corp., Object to be polished: 6 inch silicon wafer (p type, Crystal orientation <100>, Resistivity of from 1 to 10 Ω·cm)

Load: 31.5 kPa

Number of revolutions of platen: 58 rpm

Number of revolutions of wafer holder: 120 rpm

Polishing pad: Non-woven fabric Suba600 manufactured by Rodel Nitta Corp.

Feed rate of polishing composition: 8000 mL/min (use with circulation)

Polishing time: 15 minutes

Temperature of polishing composition: 23° C.

(1) Content of Metal Impurities on a Silicon Wafer Surface

After polishing, a silicon wafer was subjected to scrub cleaning with pure water. Subsequently, the naturally oxidized film of the silicon wafer surface was subjected to gas phase decomposition with hydrofluoric acid vapor and then recovered by droplets containing hydrofluoric acid and aqueous hydrogen peroxide. The metal impurities contained in the recovered solution were subjected to quantitative analysis by inductively coupled plasma mass spectrometric analysis (ICP-MS). The amount of the metal impurities was evaluated by four classes, that is, an amount of less than $1\times10^9$ atms/cm$^2$ is represented by a ◎, an amount of not less than $1\times10^9$ atms/cm$^2$ and less than $3\times10^9$ atms/cm$^2$ is represented by a ○, an amount of not less than $3\times10^9$ atms/cm$^2$ and less than $1\times10^{10}$ atms/cm$^2$ is represented by a Δ, and an amount of not less than $1\times10^{10}$ atms/cm$^2$ is represented by a X. The results are shown in Table 1.

(2) Content of Metal Impurities Present in the Inside of a Silicon Wafer

Using a hydrochloric acid-hydrogen peroxide aqueous solution (SC-2) containing a 36% hydrochloric acid solution, a 31% hydrogen peroxide solution and pure water in a volume ratio of 1:1:6, a polished silicon wafer was washed and then treated with heat at 200° C. for 48 hours, and thereby metal impurities present in the inside of the silicon wafer were transferred to the silicon wafer surface. Thereafter, in accordance with the method as described in (1) above, the amount of these metal impurities was measured and evaluated. The results are shown in Table 1.

(3) Polishing Rate

The polishing rate was calculated from the difference between the thickness of the center part of a silicon wafer before polishing and that after polishing. The difference is an average of the differences of the thicknesses, which are measured by a dial gauge, on four silicon wafers simultaneously polished with holding different wafer holders respectively. The polishing rate was evaluated by four classes, that is, a polishing rate of not lower than 1 μm/min is represented by a ◎, a polishing rate of not lower than 0.8 μm/min and lower than 1 μm/min is represented by a ○, a polishing rate of not lower than 0.5 μm/min and lower than 0.8 μm/min is represented by a Δ, and a polishing rate of lower than 0.5 μm/min is represented by a X. The results are shown in Table 1.

TABLE 1

| | Chelating agent | | Alkali compound | | | | | | Metal impurities | | | | | | | | Polishing rate |
|---|---|---|---|---|---|---|---|---|---|---|---|---|---|---|---|---|---|
| | | content (weight | | content (weight | | content (weight | | content (weight | silicon wafer surface | | | | silicon wafer inside | | | | |
| | kind | %) | kind | %) | kind | %) | kind | %) | Fe | Ni | Cu | Ca | Fe | Ni | Cu | Ca | |
| Ex. 1 | DTPPP | 0.1 | PHA | 1.5 | — | | — | | ○ | ○ | ◎ | ◎ | ◎ | ○ | ◎ | ◎ | Δ |
| Ex. 2 | DTPPP | 0.1 | NCA | 1.5 | — | | — | | ○ | ○ | ◎ | ◎ | ◎ | ○ | ◎ | ◎ | Δ |
| Ex. 3 | EDTP | 0.1 | TMAH | 2 | — | | — | | ○ | ○ | ○ | ◎ | ◎ | ○ | ○ | ◎ | ○ |
| Ex. 4 | EDTPP | 0.1 | TMAH | 2 | — | | — | | ○ | ○ | ○ | ◎ | ◎ | ○ | ○ | ◎ | ○ |
| Ex. 5 | DTPP | 0.1 | TMAH | 2 | — | | — | | ○ | ○ | ◎ | ◎ | ◎ | ○ | ◎ | ◎ | ○ |
| Ex. 6 | DTPPP | 0.01 | TMAH | 2 | — | | — | | ○ | ○ | ○ | ○ | ○ | ○ | ○ | ○ | ○ |
| Ex. 7 | DTPPP | 0.1 | TMAH | 2 | — | | — | | ○ | ○ | ◎ | ◎ | ◎ | ○ | ◎ | ◎ | ○ |
| Ex. 8 | DTPPP | 1 | TMAH | 2 | — | | — | | ○ | ◎ | ◎ | ◎ | ◎ | ◎ | ◎ | ◎ | ○ |
| Ex. 9 | TTHP | 0.1 | TMAH | 2 | — | | — | | ○ | ◎ | ◎ | ◎ | ◎ | ◎ | ◎ | ◎ | ○ |
| Ex. 10 | TTHPP | 0.1 | TMAH | 2 | — | | — | | ○ | ◎ | ◎ | ◎ | ◎ | ◎ | ◎ | ◎ | ○ |
| Ex. 11 | DTPPP | 0.1 | PIZ | 6 | — | | — | | ○ | ○ | ◎ | ◎ | ◎ | ○ | ◎ | ◎ | ◎ |
| Ex. 12 | DTPPP | 0.1 | PIZ | 6 | TMAH | 1 | — | | ○ | ○ | ◎ | ◎ | ◎ | ○ | ◎ | ◎ | ◎ |
| Ex. 13 | DTPPP | 0.1 | PHA | 0.5 | TMAH | 2 | — | | ○ | ○ | ◎ | ◎ | ◎ | ○ | ◎ | ◎ | ○ |
| Ex. 14 | DTPPP | 0.1 | PIZ | 6 | PHA | 0.5 | TMAH | 1 | ○ | ○ | ◎ | ◎ | ◎ | ○ | ◎ | ◎ | ◎ |
| C. Ex. 1 | — | | EDA | 3 | — | | — | | x | x | x | x | x | x | x | x | ◎ |
| C. Ex. 2 | — | | PHA | 1.5 | — | | — | | x | x | x | x | x | x | x | x | Δ |
| C. Ex. 3 | — | | NCA | 1.5 | — | | — | | x | x | x | x | x | x | x | x | Δ |
| C. Ex. 4 | — | | TMAH | 2 | — | | — | | x | x | x | x | x | x | x | x | ○ |
| C. Ex. 5 | EDTA | 0.1 | TMAH | 2 | — | | — | | Δ | Δ | Δ | Δ | Δ | Δ | Δ | Δ | ○ |
| C. Ex. 6 | DTPA | 0.1 | TMAH | 2 | — | | — | | Δ | ○ | ○ | Δ | Δ | ○ | ○ | Δ | ○ |
| C. Ex. 7 | NTA | 0.1 | TMAH | 2 | — | | — | | x | x | x | x | x | x | x | x | ○ |
| C. Ex. 8 | HIDA | 0.1 | TMAH | 2 | — | | — | | x | x | x | x | x | x | x | x | ○ |
| C. Ex. 9 | — | | PIZ | 6 | — | | — | | x | x | x | x | x | x | x | x | ◎ |

In Table 1, DTPA represents diethylenetriaminepentaacetic acid, NTA represents nitrilotriacetic acid, and HIDA represents hydroxyethyliminodiacetic acid.

As is clear from Table 1, in each of Examples 1 to 14, both of the silicon wafer surfaces and the silicon wafer inside have good evaluations for metal impurities and further, in each of Examples 3 to 14, the evaluation of the polishing rate is also good. However, in each of Comparative Examples 1 to 9, both of the silicon wafer surfaces and the silicon wafer inside do not have good evaluations for metal impurities. This is presumed to be due to the fact that the polishing composition in each of Comparative Examples 1 to 9 does not contain a specific chelating agent.

EXAMPLES 15 TO 28 AND COMPARATIVE EXAMPLES 10 TO 18

In each of Examples 15 to 28 and Comparative Examples 10 to 18, a rinsing composition stock solution was prepared by mixing a chelating agent, an alkali compound and water. The kinds and contents of the chelating agent and the alkali compound contained in each rinsing composition stock solution are shown in Table 2. In each of Examples 15 to 28, the rinsing composition stock solution had a pH of from 10 to 12. Each rinsing composition stock solution was diluted to 20 times with ultra pure water to prepare a rinsing composition. Using the rinsing composition, the silicon wafer surface polished in the above-described polishing conditions 1 was rinsed under the following rinsing conditions 1. It should be noted that in the following rinsing conditions 1, the description of the same items as those in polishing conditions 1 is omitted.

Rinsing Conditions 1

Object to be rinsed: 6 inch silicon wafer polished under the polishing conditions 1 using the polishing composition of Comparative Example 4

Load: 2 kPa
Number of revolutions of platen: 30 rpm
Number of revolutions of wafer holder: 62 rpm
Feed rate of rinsing composition: 8000 mL/min (no circulation)
Rinsing time: 1 minute
Temperature of rinsing composition: 20° C.

The content of metal impurities present on the silicon wafer surface after the rinsing was measured and evaluated in accordance with the method as described in (1). The results are shown in Table 2.

TABLE 2

| | Chelating agent | | Alkali compound | | | | | | Metal impurities silicon wafer surface | | | |
|---|---|---|---|---|---|---|---|---|---|---|---|---|
| | kind | content (weight %) | kind | content (weight %) | kind | content (weight %) | kind | content (weight %) | Fe | Ni | Cu | Ca |
| Ex. 15 | DTPPP | 0.1 | PHA | 1.5 | — | | — | | ○ | ○ | ◎ | ◎ |
| Ex. 16 | DTPPP | 0.1 | NCA | 1.5 | — | | — | | ○ | ○ | ◎ | ◎ |
| Ex. 17 | EDTP | 0.1 | TMAH | 2 | — | | — | | ○ | ○ | ○ | ◎ |
| Ex. 18 | EDTPP | 0.1 | TMAH | 2 | — | | — | | ○ | ○ | ○ | ◎ |
| Ex. 19 | DTPP | 0.1 | TMAH | 2 | — | | — | | ○ | ○ | ◎ | ◎ |
| Ex. 20 | DTPPP | 0.01 | TMAH | 2 | — | | — | | ○ | ○ | ○ | ○ |
| Ex. 21 | DTPPP | 0.1 | TMAH | 2 | — | | — | | ○ | ○ | ◎ | ◎ |
| Ex. 22 | DTPPP | 1 | TMAH | 2 | — | | — | | ○ | ◎ | ◎ | ◎ |
| Ex. 23 | TTHPP | 0.1 | TMAH | 2 | — | | — | | ○ | ◎ | ◎ | ◎ |
| Ex. 24 | TTHP | 0.1 | TMAH | 2 | — | | — | | ○ | ◎ | ◎ | ◎ |
| Ex. 25 | DTPPP | 0.1 | PIZ | 6 | — | | — | | ○ | ○ | ◎ | ◎ |
| Ex. 26 | DTPPP | 0.1 | PIZ | 6 | TMAH | 1 | — | | ○ | ○ | ◎ | ◎ |
| Ex. 27 | DTPPP | 0.1 | PHA | 0.5 | TMAH | 2 | — | | ○ | ○ | ◎ | ◎ |
| Ex. 28 | DTPPP | 0.1 | PIZ | 6 | PHA | 0.5 | TMAH | 1 | ○ | ○ | ◎ | ◎ |
| C. Ex. 10 | — | | EDA | 3 | — | | — | | x | x | x | x |
| C. Ex. 11 | — | | PHA | 1.5 | — | | — | | x | x | x | x |
| C. Ex. 12 | — | | NCA | 1.5 | — | | — | | x | x | x | x |
| C. Ex. 13 | — | | TMAH | 2 | — | | — | | x | x | x | x |
| C. Ex. 14 | EDTA | 0.1 | TMAH | 2 | — | | — | | Δ | Δ | Δ | Δ |
| C. Ex. 15 | DTPA | 0.1 | TMAH | 2 | — | | — | | Δ | ○ | ○ | Δ |
| C. Ex. 16 | NTA | 0.1 | TMAH | 2 | — | | — | | x | x | x | x |
| C. Ex. 17 | HIDA | 0.1 | TMAH | 2 | — | | — | | x | x | x | x |
| C. Ex. 18 | — | | PIZ | 6 | — | | — | | x | x | x | x |

As is clear from Table 2, in each of Examples 15 to 28, the silicon wafer surface has good evaluations for metal impurities. However, in each of Comparative Examples 10 to 18, the silicon wafer surface does not have good evaluations for metal impurities. This is presumed to be due to the fact that the rinsing composition in each of Comparative Examples 10 to 18 does not contain a specific chelating agent.

EXAMPLES 29 TO 42 AND COMPARATIVE EXAMPLES 19 TO 27

In each of Examples 29 to 42 and Comparative Examples 19 to 27, a polishing composition stock solution was prepared by mixing silicon dioxide, a chelating agent, an alkali compound and water. The silicon dioxide contained in each polishing composition stock solution is the same colloidal silica as that contained in the polishing composition stock solution of Example 1, and each polishing composition stock solution contains colloidal silica in an amount of 20% by weight. With regard to the chelating agent and the alkali compound contained in each polishing composition stock solution, the kinds and contents thereof are shown in Table 3. In each of Examples 29 to 42, the polishing composition has a pH of from 10 to 12. Each polishing composition stock solution was diluted to 20 times with ultra pure water to prepare a polishing composition. Using the polishing composition, the silicon wafer surface polished under polishing conditions 1 was polished under the following polishing conditions 2. In the following polishing conditions 2, the description of the same items as those in polishing conditions 1 is omitted.

Polishing Conditions 2
Object to be polished: 6 inch silicon wafer polished under the polishing conditions 1 using the polishing composition of Example 7
Load: 20.4 kPa
Polishing pad: Non-woven fabric Suba400 manufactured by Rodel Nitta Corp.
Polishing time: 10 minutes The content of metal impurities that remained on the silicon wafer surface after the polishing was measured and evaluated in accordance with the method as described in (1), and the content of metal impurities contained in the inside of the silicon wafer after the polishing was measured and evaluated in accordance with the method as described in (2). Furthermore, the polishing rate was calculated in accordance with the method as described in (3) and evaluated by four classes, that is, that polishing rate of not lower than 0.6 μm/min is represented by a ◎, a polishing rate of not lower than 0.45 μm/min and lower than 0.6 μm/min is represented by a ○, a polishing rate of not lower than 0.3 μm/min and lower than 0.45 μm/min is represented by a Δ, and a polishing rate of lower than 0.3 μm/min is represented by a X. The results are shown in Table 3.

good. However, in each of Comparative Examples 19 to 27, both of the silicon wafer surfaces and the silicon wafer inside do not have good evaluations for metal impurities. This is presumed to be due to the fact that the polishing composition in each of Comparative Examples 19 to 27 does not contain a specific chelating agent.

EXAMPLES 43 TO 56 AND COMPARATIVE EXAMPLES 28 TO 36

In each of Examples 43 to 56 and Comparative Examples 28 to 36, a rinsing composition stock solution was prepared by mixing a chelating agent, an alkali compound and water. The kinds and contents of the chelating agent and the alkali compound contained in each rinsing composition stock solution are shown in Table 4. In each of Examples 43 to 56, the rinsing composition stock solution had a pH of from 10 to 12. Each rinsing composition stock solution was diluted to 20 times with ultra pure water to prepare a rinsing composition. Using the rinsing composition, the silicon wafer surface polished under the above-described polishing conditions 2 was rinsed under the following rinsing conditions 2. It should be noted that in the following rinsing conditions 2, the description of the same items as those in polishing conditions 1 is omitted.

Rinsing Conditions 2
Object to be rinsed: 6 inch silicon wafer polished in the polishing conditions 2 using the polishing composition of Comparative Example 22
Polishing pad: Non-woven fabric Suba400 manufactured by Rodel Nitta Corp.

TABLE 3

| | Chelating agent | | Alkali compound | | | | | | Metal impurities | | | | | | | | Polishing rate |
|---|---|---|---|---|---|---|---|---|---|---|---|---|---|---|---|---|---|
| | | | | | | | | | silicon wafer surface | | | | silicon wafer inside | | | | |
| | kind | content (weight %) | kind | content (weight %) | kind | content (weight %) | kind | content (weight %) | Fe | Ni | Cu | Ca | Fe | Ni | Cu | Ca | |
| Ex. 29 | DTPPP | 0.1 | PHA | 1.5 | — | | — | | ○ | ○ | ◎ | ◎ | ◎ | ○ | ◎ | ◎ | Δ |
| Ex. 30 | DTPPP | 0.1 | NCA | 1.5 | — | | — | | ○ | ○ | ○ | ◎ | ◎ | ○ | ○ | ◎ | Δ |
| Ex. 31 | EDTP | 0.1 | TMAH | 2 | — | | — | | ○ | ○ | ○ | ◎ | ◎ | ○ | ○ | ◎ | ○ |
| Ex. 32 | EDTPP | 0.1 | TMAH | 2 | — | | — | | ○ | ○ | ○ | ◎ | ◎ | ○ | ○ | ◎ | ○ |
| Ex. 33 | DTPP | 0.1 | TMAH | 2 | — | | — | | ○ | ○ | ◎ | ◎ | ◎ | ○ | ◎ | ◎ | ○ |
| Ex. 34 | DTPPP | 0.01 | TMAH | 2 | — | | — | | ○ | ○ | ○ | ○ | ◎ | ○ | ○ | ○ | ○ |
| Ex. 35 | DTPPP | 0.1 | TMAH | 2 | — | | — | | ○ | ○ | ◎ | ◎ | ◎ | ○ | ◎ | ◎ | ○ |
| Ex. 36 | DTPPP | 1 | TMAH | 2 | — | | — | | ○ | ◎ | ◎ | ◎ | ◎ | ◎ | ◎ | ◎ | ○ |
| Ex. 37 | TTHPP | 0.1 | TMAH | 2 | — | | — | | ○ | ◎ | ◎ | ◎ | ◎ | ◎ | ◎ | ◎ | ○ |
| Ex. 38 | TTHP | 0.1 | TMAH | 2 | — | | — | | ○ | ◎ | ◎ | ◎ | ◎ | ◎ | ◎ | ◎ | ○ |
| Ex. 39 | DTPPP | 0.1 | PIZ | 6 | — | | — | | ○ | ○ | ◎ | ◎ | ◎ | ○ | ◎ | ◎ | ◎ |
| Ex. 40 | DTPPP | 0.1 | PIZ | 6 | TMAH | 1 | — | | ○ | ○ | ◎ | ◎ | ◎ | ○ | ◎ | ◎ | ◎ |
| Ex. 41 | DTPPP | 0.1 | PHA | 0.5 | TMAH | 2 | — | | ○ | ○ | ◎ | ◎ | ◎ | ○ | ◎ | ◎ | ○ |
| Ex. 42 | DTPPP | 0.1 | PIZ | 6 | PHA | 0.5 | TMAH | 1 | ○ | ○ | ◎ | ◎ | ◎ | ○ | ◎ | ◎ | ◎ |
| C. Ex. 19 | — | | EDA | 3 | — | | — | | x | x | x | x | x | x | x | x | ◎ |
| C. Ex. 20 | — | | PHA | 1.5 | — | | — | | x | x | x | x | x | x | x | x | Δ |
| C. Ex. 21 | — | | NCA | 1.5 | — | | — | | x | x | x | x | x | x | x | x | Δ |
| C. Ex. 22 | — | | TMAH | 2 | — | | — | | x | x | x | x | x | x | x | x | ○ |
| C. Ex. 23 | EDTA | 0.1 | TMAH | 2 | — | | — | | Δ | Δ | Δ | Δ | Δ | Δ | Δ | Δ | ○ |
| C. Ex. 24 | DTPA | 0.1 | TMAH | 2 | — | | — | | Δ | ○ | ○ | Δ | Δ | ○ | ○ | Δ | ○ |
| C. Ex. 25 | NTA | 0.1 | TMAH | 2 | — | | — | | x | x | x | x | x | x | x | x | ○ |
| C. Ex. 26 | HIDA | 0.1 | TMAH | 2 | — | | — | | x | x | x | x | x | x | x | x | ○ |
| C. Ex. 27 | — | | PIZ | 6 | — | | — | | x | x | x | x | x | x | x | x | ◎ |

As is clear from Table 3, in each of Examples 29 to 42, both of the silicon wafer surfaces and the silicon wafer inside have good evaluations for metal impurities and further, in each of Examples 31 to 42, the evaluation of the polishing rate is also The content of metal impurities that remained on the silicon wafer surface after the rinsing was measured and evaluated in accordance with the method as described in (1). The results are shown in Table 4.

TABLE 4

| | Chelating agent | | Alkali compound | | | | | | Metal impurities silicon wafer surface | | | |
|---|---|---|---|---|---|---|---|---|---|---|---|---|
| | kind | content (weight %) | kind | content (weight %) | kind | content (weight %) | kind | content (weight %) | Fe | Ni | Cu | Ca |
| Ex. 43 | DTPPP | 0.1 | PHA | 1.5 | — | | — | | ○ | ○ | ◎ | ◎ |
| Ex. 44 | DTPPP | 0.1 | NCA | 1.5 | — | | — | | ○ | ○ | ◎ | ◎ |
| Ex. 45 | EDTP | 0.1 | TMAH | 2 | — | | — | | ○ | ○ | ○ | ◎ |
| Ex. 46 | EDTPP | 0.1 | TMAH | 2 | — | | — | | ○ | ○ | ○ | ◎ |
| Ex. 47 | DTPP | 0.1 | TMAH | 2 | — | | — | | ○ | ○ | ◎ | ◎ |
| Ex. 48 | DTPPP | 0.01 | TMAH | 2 | — | | — | | ○ | ○ | ○ | ○ |
| Ex. 49 | DTPPP | 0.1 | TMAH | 2 | — | | — | | ○ | ○ | ◎ | ◎ |
| Ex. 50 | DTPPP | 1 | TMAH | 2 | — | | — | | ○ | ◎ | ◎ | ◎ |
| Ex. 51 | TTHPP | 0.1 | TMAH | 2 | — | | — | | ○ | ◎ | ◎ | ◎ |
| Ex. 52 | TTHP | 0.1 | TMAH | 2 | — | | — | | ○ | ◎ | ◎ | ◎ |
| Ex. 53 | DTPPP | 0.1 | PIZ | 6 | — | | — | | ○ | ○ | ◎ | ◎ |
| Ex. 54 | DTPPP | 0.1 | PIZ | 6 | TMAH | 1 | — | | ○ | ○ | ◎ | ◎ |
| Ex. 55 | DTPPP | 0.1 | PHA | 0.5 | TMAH | 2 | — | | ○ | ○ | ◎ | ◎ |
| Ex. 56 | DTPPP | 0.1 | PIZ | 6 | PHA | 0.5 | TMAH | 1 | ○ | ○ | ◎ | ◎ |
| C. Ex. 28 | — | | EDA | 3 | — | | — | | x | x | x | x |
| C. Ex. 29 | — | | PHA | 1.5 | — | | — | | x | x | x | x |
| C. Ex. 30 | — | | NCA | 1.5 | — | | — | | x | x | x | x |
| C. Ex. 31 | — | | TMAH | 2 | — | | — | | x | x | x | x |
| C. Ex. 32 | EDTA | 0.1 | TMAH | 2 | — | | — | | Δ | Δ | Δ | Δ |
| C. Ex. 33 | DTPA | 0.1 | TMAH | 2 | — | | — | | Δ | ○ | ○ | Δ |
| C. Ex. 34 | NTA | 0.1 | TMAH | 2 | — | | — | | x | x | x | x |
| C. Ex. 35 | HIDA | 0.1 | TMAH | 2 | — | | — | | x | x | x | x |
| C. Ex. 36 | — | | PIZ | 6 | — | | — | | x | x | x | x |

As is clear from Table 4, in each of Examples 43 to 56, the silicon wafer surface has good evaluations for metal impurities. However, in each of Comparative Examples 28 to 36, the silicon wafer surface does not have good evaluations for metal impurities. This is presumed to be due to the fact that the rinsing composition in each of Comparative Examples 28 to 36 does not contain a specific chelating agent.

EXAMPLES 57 TO 72 AND COMPARATIVE EXAMPLES 37 TO 44

In each of Examples 57 to 72 and Comparative Examples 37 to 44, a polishing composition stock solution was prepared by mixing either one of additives of hydroxyethyl cellulose (HEC) or polyvinyl alcohol (PVA) in addition to silicon dioxide, a chelating agent, an alkali compound and water. The hydroxyethyl cellulose has an average molecular weight of 1200000, and the polyvinyl alcohol has a degree of saponification of 100%, a degree of polymerization of 1400, and an average molecular weight of 62000. The silicon dioxide contained in each polishing composition stock solution was the same colloidal silica as that contained in the polishing composition stock solution of Example 1, and each polishing composition stock solution contained colloidal silica in an amount of 20% by weight. With regard to the chelating agent, the alkali compound and the additive contained in each polishing composition stock solution, the kinds and contents thereof are shown in Table 5. In each of Examples 57 to 72, the polishing composition had a pH of from 10 to 12. Each polishing composition stock solution was diluted to 200 times with ultra pure water to prepare a polishing composition. Using the polishing composition, the silicon wafer surface polished under the polishing conditions 2 was polished under the following polishing conditions 3. In the following polishing conditions 3, the description of the same items as those in polishing conditions 1 is omitted.

Polishing Conditions 3
  Object to be polished: 6 inch silicon wafer polished in the polishing conditions 2 using the polishing composition of Example 35
  Load: 9.4 kPa
  Polishing pad: Surfin000 manufactured by Fujimi Incorporated
  Feed rate of polishing composition: 500 mL/min (no circulation)
  Polishing time: 8 minutes
  Temperature of polishing composition: 20° C.
  The content of metal impurities that remained on the silicon wafer surface after the polishing was measured and evaluated in accordance with the method as described in (1), and the content of metal impurities contained in the silicon wafer inside after the polishing was measured and evaluated in accordance with the method as described in (2). The results are shown in Table 5.

TABLE 5

| | Chelating agent | | Alkali compound | | | | | |
|---|---|---|---|---|---|---|---|---|
| | kind | content (weight %) | kind | content (weight %) | kind | content (weight %) | kind | content (weight %) |
| Ex. 57 | EDTP | 0.1 | AM | 1 | — | | — | |
| Ex. 58 | EDTPP | 0.1 | AM | 1 | — | | — | |
| Ex. 59 | DTPP | 0.1 | AM | 1 | — | | — | |

TABLE 5-continued

| | | | | | | | | |
|---|---|---|---|---|---|---|---|---|
| Ex. 60 | DTPPP | 0.01 | AM | 1 | — | | — | |
| Ex. 61 | DTPPP | 0.1 | AM | 1 | — | | — | |
| Ex. 62 | DTPPP | 1 | AM | 1 | — | | — | |
| Ex. 63 | TTHPP | 0.1 | AM | 1 | — | | — | |
| Ex. 64 | TTHP | 0.1 | AM | 1 | — | | — | |
| Ex. 65 | DTPPP | 0.1 | AM | 1 | — | | — | |
| Ex. 66 | DTPPP | 0.1 | PHA | 0.3 | — | | — | |
| Ex. 67 | DTPPP | 0.1 | TMAH | 0.5 | — | | — | |
| Ex. 68 | DTPPP | 0.1 | PIZ | 0.5 | — | | — | |
| Ex. 69 | DTPPP | 0.1 | AM | 0.5 | PHA | 0.15 | — | |
| Ex. 70 | DTPPP | 0.1 | AM | 0.5 | TMAH | 0.25 | — | |
| Ex. 71 | DTPPP | 0.1 | PIZ | 0.25 | TMAH | 0.25 | — | |
| Ex. 72 | DTPPP | 0.1 | PHA | 0.1 | TMAH | 0.2 | PIZ | 0.2 |
| C. Ex. 37 | — | | AM | 1 | — | | — | |
| C. Ex. 38 | EDTA | 0.1 | AM | 1 | — | | — | |
| C. Ex. 39 | DTPA | 0.1 | AM | 1 | — | | — | |
| C. Ex. 40 | NTA | 0.1 | AM | 1 | — | | — | |
| C. Ex. 41 | HIDA | 0.1 | AM | 1 | — | | — | |
| C. Ex. 42 | — | | PHA | 0.3 | — | | — | |
| C. Ex. 43 | — | | TMAH | 0.5 | — | | — | |
| C. Ex. 44 | — | | PIZ | 0.5 | — | | — | |

| | Additive | | Metal impurities | | | | | | | |
|---|---|---|---|---|---|---|---|---|---|---|
| | | | silicon wafer surface | | | | silicon wafer inside | | | |
| | kind | content (weight %) | Fe | Ni | Cu | Ca | Fe | Ni | Cu | Ca |
| Ex. 57 | HEC | 0.25 | ○ | ○ | ○ | ◎ | ◎ | ○ | ○ | ◎ |
| Ex. 58 | HEC | 0.25 | ○ | ○ | ◎ | ◎ | ◎ | ○ | ◎ | ◎ |
| Ex. 59 | HEC | 0.25 | ○ | ○ | ◎ | ◎ | ◎ | ○ | ◎ | ◎ |
| Ex. 60 | HEC | 0.25 | ○ | ○ | ○ | ○ | ◎ | ○ | ○ | ○ |
| Ex. 61 | HEC | 0.25 | ○ | ○ | ◎ | ◎ | ◎ | ○ | ◎ | ◎ |
| Ex. 62 | HEC | 0.25 | ○ | ◎ | ◎ | ◎ | ◎ | ◎ | ◎ | ◎ |
| Ex. 63 | HEC | 0.25 | ○ | ◎ | ◎ | ◎ | ◎ | ◎ | ◎ | ◎ |
| Ex. 64 | HEC | 0.25 | ○ | ◎ | ◎ | ◎ | ◎ | ◎ | ◎ | ◎ |
| Ex. 65 | PVA | 0.25 | ○ | ○ | ◎ | ◎ | ◎ | ○ | ◎ | ◎ |
| Ex. 66 | HEC | 0.25 | ○ | ○ | ◎ | ◎ | ◎ | ○ | ◎ | ◎ |
| Ex. 67 | HEC | 0.25 | ○ | ○ | ◎ | ◎ | ◎ | ○ | ◎ | ◎ |
| Ex. 68 | HEC | 0.25 | ○ | ○ | ◎ | ◎ | ◎ | ○ | ◎ | ◎ |
| Ex. 69 | HEC | 0.25 | ○ | ○ | ◎ | ◎ | ◎ | ○ | ◎ | ◎ |
| Ex. 70 | HEC | 0.25 | ○ | ○ | ◎ | ◎ | ◎ | ◎ | ◎ | ◎ |
| Ex. 71 | HEC | 0.25 | ○ | ○ | ◎ | ◎ | ◎ | ○ | ◎ | ◎ |
| Ex. 72 | HEC | 0.25 | ○ | ○ | ◎ | ◎ | ◎ | ○ | ◎ | ◎ |
| C. Ex. 37 | HEC | 0.25 | × | × | × | × | × | × | × | × |
| C. Ex. 38 | HEC | 0.25 | Δ | Δ | Δ | Δ | Δ | Δ | Δ | Δ |
| C. Ex. 39 | HEC | 0.25 | Δ | ○ | ○ | Δ | Δ | ○ | ○ | Δ |
| C. Ex. 40 | HEC | 0.25 | × | × | × | × | × | × | × | × |
| C. Ex. 41 | HEC | 0.25 | × | × | × | × | × | × | × | × |
| C. Ex. 42 | HEC | 0.25 | × | × | × | × | × | × | × | × |
| C. Ex. 43 | HEC | 0.25 | × | × | × | × | × | × | × | × |
| C. Ex. 44 | HEC | 0.25 | × | × | × | × | × | × | × | × |

In Table 5, AM represents a 29% by weight ammonia aqueous solution. As is clear from Table 5, in each of Examples 57 to 72, both the silicon wafer surface and the silicon wafer inside have good evaluations for metal impurities. However, in each of Comparative Examples 37 to 44, both the silicon wafer surface and the silicon wafer inside do not have good evaluations for metal impurities. This is presumed to be due to the fact that the polishing composition in each of Comparative Examples 37 to 44 does not contain a specific chelating agent.

EXAMPLES 73 TO 88 AND COMPARATIVE EXAMPLES 45 TO 52

In each of Examples 73 to 88 and Comparative Examples 45 to 52, a rinsing composition stock solution was prepared by mixing either one of additives of HEC or PVA in addition to a chelating agent, an alkali compound and water. The hydroxyethyl cellulose had an average molecular weight of 1200000, and the polyvinyl alcohol had a degree of saponification of 100%, a degree of polymerization of 1400, and an average molecular weight of 62000. With regard to the chelating agent, the alkali compound and the additive contained in each rinsing composition stock solution, the kinds and contents thereof are shown in Table 6. In each of Examples 73 to 88, the rinsing composition stock solution had a pH of from 10 to 12. Each rinsing composition stock solution was diluted to 20 times with ultra pure water to prepare a rinsing composition. Using the rinsing composition, the silicon wafer surface polished under the above-described polishing conditions 3 was rinsed under the following rinsing conditions 3. In the following rinsing conditions 3, the description of the same items as those in rinsing conditions 1 is omitted.

Rinsing Conditions 3
Object to be rinsed: 6 inch silicon wafer polished under polishing conditions 3 using the polishing composition of Comparative Example 43
Polishing pad: Surfin000 manufactured by Fujimi Incorporated
Feed rate of rinsing composition: 2000 mL/min (no circulation)
Rinsing time: 30 seconds
The content of metal impurities on the silicon wafer surface after the rinsing was measured and evaluated in accordance with the method as described in (1). The results are shown in Table 6.

or a salt thereof, and wherein in the chemical formula, each of $Y^2$ and $Y^3$ represents an Alkylene group, n is an integer of 0 to 4,

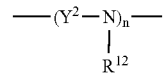

is a bond when n is zero, each of 4+n substituents represented by $R^8$ to $R^{12}$ is an alkyl group and at least four of the alkyl groups have a phosphonic acid group.

TABLE 6

| | Chelating agent | | Alkali compound | | | | | | Additive | | Metal impurities silicon wafer surface | | | |
|---|---|---|---|---|---|---|---|---|---|---|---|---|---|---|
| | kind | content (weight %) | kind | content (weight %) | kind | content (weight %) | kind | content (weight %) | kind | content (weight %) | Fe | Ni | Cu | Ca |
| Ex. 73 | EDTP | 0.1 | AM | 1 | — | | — | | HEC | 0.25 | ○ | ○ | ○ | ◎ |
| Ex. 74 | EDTPP | 0.1 | AM | 1 | — | | — | | HEC | 0.25 | ○ | ○ | ○ | ◎ |
| Ex. 75 | DTPP | 0.1 | AM | 1 | — | | — | | HEC | 0.25 | ○ | ○ | ◎ | ◎ |
| Ex. 76 | DTPPP | 0.01 | AM | 1 | — | | — | | HEC | 0.25 | ○ | ○ | ○ | ○ |
| Ex. 77 | DTPPP | 0.1 | AM | 1 | — | | — | | HEC | 0.25 | ○ | ○ | ◎ | ◎ |
| Ex. 78 | DTPPP | 1 | AM | 1 | — | | — | | HEC | 0.25 | ○ | ◎ | ◎ | ◎ |
| Ex. 79 | TTHPP | 0.1 | AM | 1 | — | | — | | HEC | 0.25 | ○ | ◎ | ◎ | ◎ |
| Ex. 80 | TTHP | 0.1 | AM | 1 | — | | — | | HEC | 0.25 | ○ | ◎ | ◎ | ◎ |
| Ex. 81 | DTPPP | 0.1 | AM | 1 | — | | — | | PVA | 0.25 | ○ | ○ | ◎ | ◎ |
| Ex. 82 | DTPPP | 0.1 | PHA | 0.3 | — | | — | | HEC | 0.25 | ○ | ○ | ◎ | ◎ |
| Ex. 83 | DTPPP | 0.1 | TMAH | 0.5 | — | | — | | HEC | 0.25 | ○ | ○ | ◎ | ◎ |
| Ex. 84 | DTPPP | 0.1 | PIZ | 0.5 | — | | — | | HEC | 0.25 | ○ | ○ | ◎ | ◎ |
| Ex. 85 | DTPPP | 0.1 | AM | 0.5 | PHA | 0.15 | — | | HEC | 0.25 | ○ | ○ | ◎ | ◎ |
| Ex. 86 | DTPPP | 0.1 | AM | 0.5 | TMAH | 0.25 | — | | HEC | 0.25 | ○ | ○ | ◎ | ◎ |
| Ex. 87 | DTPPP | 0.1 | PIZ | 0.25 | TMAH | 0.25 | — | | HEC | 0.25 | ○ | ○ | ◎ | ◎ |
| Ex. 88 | DTPPP | 0.1 | PHA | 0.1 | TMAH | 0.2 | PIZ | 0.2 | HEC | 0.25 | ○ | ○ | ◎ | ◎ |
| C. Ex. 45 | — | | AM | 1 | — | | — | | HEC | 0.25 | x | x | x | x |
| C. Ex. 46 | EDTA | 0.1 | AM | 1 | — | | — | | HEC | 0.25 | △ | △ | △ | △ |
| C. Ex. 47 | DTPA | 0.1 | AM | 1 | — | | — | | HEC | 0.25 | △ | ○ | ○ | △ |
| C. Ex. 48 | NTA | 0.1 | AM | 1 | — | | — | | HEC | 0.25 | x | x | x | x |
| C. Ex. 49 | HIDA | 0.1 | AM | 1 | — | | — | | HEC | 0.25 | x | x | x | x |
| C. Ex. 50 | — | | PHA | 0.3 | — | | — | | HEC | 0.25 | x | x | x | x |
| C. Ex. 51 | — | | TMAH | 0.5 | — | | — | | HEC | 0.25 | x | x | x | x |
| C. Ex. 52 | — | | PIZ | 0.5 | — | | — | | HEC | 0.25 | x | x | x | x |

In Table 6, AM represents a 29% by weight ammonia aqueous solution. As is clear from Table 6, in each of Examples 73 to 88, the silicon wafer surface has good evaluations for metal impurities. However, in each of Comparative Examples 45 to 52, the silicon wafer surface does not have good evaluations for metal impurities. This is presumed to be due to the fact that the polishing composition in each of Comparative Examples 45 to 52 does not contain a specific chelating agent.

The invention claimed is:

1. A polishing composition for use in polishing a silicon wafer, the polishing composition consisting of a chelating agent, an alkali compound, silicon dioxide and water, wherein the chelating agent is an acid represented by the following chemical formula:

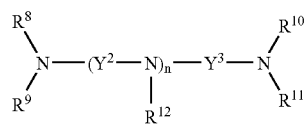

2. The polishing composition according to claim 1, wherein the alkylene group is a lower alkylene group having 1 to 4 carbon atoms.

3. The polishing composition according to claim 1, wherein the alkyl group is a lower alkyl group having 1 to 4 carbon atoms.

4. The polishing composition according to claim 1, wherein all the alkyl groups have a phosphonic acid group.

5. The polishing composition according to claim 1, wherein the chelating agent contains at least one compound selected from ethylenediaminetetraethylenephosphonic acid, ethylenediaminetetramethylenephosphonic acid, diethylenetriaminepentaethylenephosphonic acid, diethylenetriaminepentamethylenephosphonic acid, triethylenetetraminehexaethylenephosphonic acid, triethylenetetraminehexamethylenephosphonic acid, propanediaminetetraethylenephosphonic acid and propanediaminetetramethylenephosphonic acid, and ammonium salts, potassium salts, sodium salts and lithium salts of these acids.

6. The polishing composition according to claim 1, wherein the polishing composition has a pH of from 8 to 12.

7. The polishing composition according to claim 1, wherein n in the chemical formula is an integer of 0 to 2.

8. A process for polishing a silicon wafer, the process comprising:
preparing a polishing composition and
polishing the surface of the silicon wafer by using the polishing composition,
wherein the polishing composition consists of a chelating agent, an alkali compound, silicon dioxide and water, wherein the chelating agent is an acid represented by the following chemical formula:

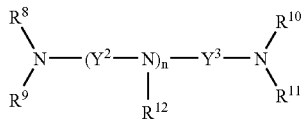

or a salt thereof, and wherein in the chemical formula, each of $Y^2$ and $Y^3$ represents an alkylene group, n is an integer of 0 to 4,

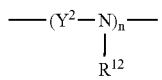

is a bond when n is zero each of 4+n substituents represented by $R^8$ to $R^{12}$ is an alkyl group and at least four of the alkyl groups have a phosphonic acid group.

9. The process according to claim 8 further comprising:
preparing a rinsing composition and
rinsing the surface of the silicon wafer by using the rinsing composition after polishing the surface of the silicon wafer by using the polishing composition,
wherein the rinsing composition includes a chelating agent, an alkali compound and water, wherein the chelating agent is an acid represented by the following chemical formula:

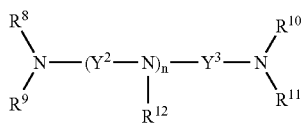

or a salt thereof, and wherein in the chemical formula, each of $Y^2$ and $Y^3$ represents an alkylene group, n is an integer of 0 to 4,

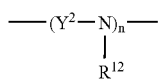

is a bond when n is zero, each of 4+n substituents represented by $R^8$ to $R^8$ is an alkyl group and at least four of the alkyl groups have a phosphonic acid group.

10. The process according to claim 9, wherein the alkylene group of the chelating agent in the rising composition is a lower alkylene group having 1 to 4 carbon atoms.

11. The process according to claim 9, wherein the alkyl group of the chelating agent in the rising composition is a lower alkyl group having 1 to 4 carbon atoms.

12. The process according to claim 9, wherein all the alkyl groups of the chelating agent in the rising composition have a phosphonic acid group.

13. The process according to claim 9, wherein the chelating agent in the rising composition contains at least one compound selected from ethylenediaminetetraethylenephosphonic acid, ethylenediaminetetramethylenephosphonic acid, diethylenetriaminepentaethylenephosphonic acid, diethylenetriaminepentamethylenephosphonic acid, triethylenetetraminehexaethylenephosphonic acid, triethylenetetraminehexamethylenephosphonic acid, propanediaminetetraethylenephosphonic acid and propanediamine tetramethylenephosphonic acid, and ammonium salts, potassium salts, sodium salts and lithium salts of these acids.

14. The process according to claim 9, wherein the rinsing composition has a pH of from 8 to 12.

15. The process according to claim 9, wherein n in the chemical formula of the chelating agent in the rising composition is an integer of 0 to 2.

16. A polishing composition for use in polishing a silicon wafer, the polishing composition consisting of a chelating agent, an alkali compound, silicon dioxide, water and at least one selected from the group consisting of a surfactant and an antiseptic agent, wherein the chelating agent is an acid represented by the following chemical formula:

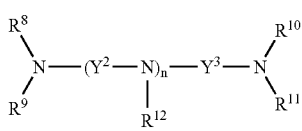

or a salt thereof, and wherein in the chemical formula, each of $Y^2$ and $Y^3$ represents an alkylene group, n is an integer of 0 to 4,

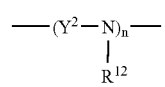

is a bond when n is zero, each of 4+n substituents represented by $R^8$ to $R^{12}$ is an alkyl group and at least four of the alkyl groups have a phosphonic acid group.

17. A process for polishing a silicon wafer, the process comprising:
preparing a polishing composition and
polishing the surface of the silicon wafer by using the polishing composition,
wherein the polishing composition consists of a chelating agent, an alkali compound, silicon dioxide, water and at least one selected from the group consisting of a surfactant and an antiseptic agent, wherein the chelating agent is an acid represented by the following chemical formula:

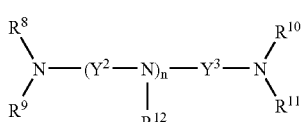

or a salt thereof, and wherein in the chemical formula, each of $Y^2$ and $Y^3$ represents an alkylene group, n is an integer of 0 to 4,

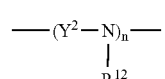

is a bond when n is zero, each of 4+n substituents represented by $R^8$ to $R^{12}$ is an alkyl group and at least four of the alkyl groups have a phosphonic acid group.

* * * * *

UNITED STATES PATENT AND TRADEMARK OFFICE
CERTIFICATE OF CORRECTION

| | | |
|---|---|---|
| PATENT NO. | : 7,481,949 B2 | Page 1 of 1 |
| APPLICATION NO. | : 10/533888 | |
| DATED | : January 27, 2009 | |
| INVENTOR(S) | : Akihito Kawase et al. | |

It is certified that error appears in the above-identified patent and that said Letters Patent is hereby corrected as shown below:

On Title Page at (73) should read

Fujimi Incorporated, Nishikasugai-gun (JP)

Signed and Sealed this

Twenty-first Day of December, 2010

David J. Kappos
*Director of the United States Patent and Trademark Office*